(12) United States Patent
Kado et al.

(10) Patent No.: US 9,624,599 B2
(45) Date of Patent: Apr. 18, 2017

(54) SIC SINGLE CRYSTAL MANUFACTURING METHOD USING ALTERNATING STATES OF SUPERSATURATION

(75) Inventors: Motohisa Kado, Toyota (JP); Hironori Daikoku, Toyota (JP); Kazuhiko Kusunoki, Chiyoda-ku (JP)

(73) Assignees: TOYOTA JIDOSHA KABUSHIKI KAISHA, Toyota-shi (JP); NIPPON STEEL & SUMITOMO METAL CORPORATION, Tokyo (JP)

( * ) Notice: Subject to any disclaimer, the term of this patent is extended or adjusted under 35 U.S.C. 154(b) by 344 days.

(21) Appl. No.: 14/350,448

(22) PCT Filed: Dec. 9, 2011

(86) PCT No.: PCT/JP2011/078592
§ 371 (c)(1),
(2), (4) Date: Apr. 17, 2014

(87) PCT Pub. No.: WO2013/065204
PCT Pub. Date: May 10, 2013

(65) Prior Publication Data
US 2014/0245945 A1 Sep. 4, 2014

(30) Foreign Application Priority Data

Oct. 31, 2011 (JP) ................................. 2011-239494

(51) Int. Cl.
*C30B 15/22* (2006.01)
*C30B 19/04* (2006.01)
(Continued)

(52) U.S. Cl.
CPC .............. *C30B 15/22* (2013.01); *C30B 15/02* (2013.01); *C30B 19/04* (2013.01); *C30B 29/36* (2013.01)

(58) Field of Classification Search
CPC .. C30B 9/00; C30B 9/04; C30B 15/00; C30B 15/02; C30B 15/14; C30B 15/20;
(Continued)

(56) References Cited

U.S. PATENT DOCUMENTS 9,080,254 B2 * 7/2015 Sakamoto ................. C30B 9/06
2005/0183657 A1 8/2005 Kusunoki et al.
(Continued)

FOREIGN PATENT DOCUMENTS

CN 1863945 11/2006
EP 1 806 437 A1 7/2007
(Continued)

OTHER PUBLICATIONS

Office Action mailed Jun. 11, 2014 in U.S. Appl. No. 13/202,096.
(Continued)

*Primary Examiner* — Kenneth A Bratland, Jr.
(74) *Attorney, Agent, or Firm* — Oblon, McClelland, Maier & Neustadt, L.L.P.

(57) ABSTRACT

A SiC single crystal manufacturing method whereby growing speed improvement required to have high productivity can be achieved, while maintaining flat growth in which uniform single crystal growth can be continued at the time of growing a SiC single crystal using a solution method. In the method, a SiC single crystal is grown in a crucible from a Si solution containing C. The method includes alternately repeating: a high supersaturation degree growing period, in which the growth is promoted by maintaining the supersaturation degree of C in the Si solution higher than an upper limit critical value at which flat growth can be maintained, the supersaturation degree being at a growing interface between the Si solution and a SiC single crystal being grown; and a low supersaturation degree growing period, in
(Continued)

which the growth is promoted by maintaining the supersaturation degree lower than the critical value.

4 Claims, 11 Drawing Sheets

(51) Int. Cl.
*C30B 29/36* (2006.01)
*C30B 15/02* (2006.01)

(58) Field of Classification Search
CPC ....... C30B 15/203; C30B 15/22; C30B 19/00;
C30B 19/02; C30B 19/04; C30B 19/08;
C30B 19/10; C30B 29/00; C30B 29/36
USPC .... 117/11, 13–15, 35–36, 54–56, 60, 73–74,
117/78, 937, 951
See application file for complete search history.

(56) References Cited

U.S. PATENT DOCUMENTS

| 2006/0292057 A1 | 12/2006 | Nakamura |
| 2007/0209573 A1 | 9/2007 | Kusunoki et al. |
| 2011/0315073 A1* | 12/2011 | Sakamoto ................ C30B 9/06 117/28 |

FOREIGN PATENT DOCUMENTS

| JP | 6 271388 | 9/1994 |
| JP | 6 316483 | 11/1994 |
| JP | 2000-302599 A * | 10/2000 |
| JP | 2003 512282 | 4/2003 |
| JP | 2004-2173 A | 1/2004 |
| JP | 2005-179080 A | 7/2005 |
| JP | 2006-69861 A | 3/2006 |
| JP | 2006-117441 A | 5/2006 |
| JP | 2007-284301 A | 11/2007 |
| JP | 2008-100854 A | 5/2008 |
| JP | 2008-100890 A | 5/2008 |
| JP | 2010-208926 A | 9/2010 |
| WO | WO 2010/103387 A1 | 9/2010 |
| WO | WO 2010-103387 A1 * | 9/2010 |

OTHER PUBLICATIONS

Office Action mailed Nov. 21, 2014 in U.S. Appl. No. 13/202,096.
Office Action mailed Nov. 28, 2014 in U.S. Appl. No. 13/202,096.
Office Action mailed Dec. 8, 2014 in U.S. Appl. No. 13/202,096.
Y.C. Liu, et al., "Effects of cycle patterns of accelerated crucible rotation technique (ACRT) on the flows, interface, and segregation in vertical Bridgman crystal growth" Science Direct, International Journal or Heat and Mass Transfer, vol. 50, 2007, pp. 5031-5040.
Dieter H. Hofmann, et al., "Prospects of the use of liquid phase techniques for the growth of bulk silicon carbide crystals" Materials Science and Engineering, vol. B61-62, 1999, pp. 29-39.
K. Kusunoki, et al., "Solution growth of SiC crystal with high growth rate using accelerated crucible rotation technique" Materials Science Forum, vols. 527-529, XP008122535, 2006, pp. 119-122.
H. J. Scheel, et al., "Flux Growth of Large Crystals by Accelerated Crucible-Rotation Technique" Journal of Crystal Growth, vol. 8, 1971, pp. 304-306.
International Search Report Issued Feb. 14, 2012 in PCT/JP11/078592 Filed Dec. 9, 2011.

* cited by examiner

FLAT GROWTH: POOR
GROWTH RATE: 0.57mm/hr (2)

FLAT GROWTH: POOR
GROWTH RATE: 0.51mm/hr (3)

SOLUTION ADHERING SECTION
FLAT GROWTH: GOOD
GROWTH RATE: 0.52mm/hr

(1) *SEVERE ROUGHNESS AT GROWTH BOUNDARY, LARGE AMOUNT OF SOLUTION ADHESION 3 mm

FLAT GROWTH: POOR
GROWTH RATE: 0.68mm/hr (2) SOLUTION ADHERING SECTION 3 mm

FLAT GROWTH: GOOD
GROWTH RATE: 0.72mm/hr

SIC SINGLE CRYSTAL MANUFACTURING METHOD USING ALTERNATING STATES OF SUPERSATURATION

TECHNICAL FIELD

The present invention relates to a method for manufacturing a SiC single crystal by a solution method.

BACKGROUND ART

Methods for manufacturing SiC single crystals by solution methods, which are typically top seeded solution growth (TSSG) methods, maintain a temperature gradient in which the temperature falls from the lower section to the upper section in a Si solution in a graphite crucible, from the interior toward the solution surface. The C that has dissolved from the graphite crucible into the Si solution at the high temperature section at the bottom, primarily rides the convection current of the solution and rises, reaching the low temperature section near the solution surface and becoming supersaturated. By holding a SiC seed crystal at the tip of a support rod (graphite) and contacting the solution with the bottom side of the seed crystal as a crystal growth plane, a SiC single crystal grows from the supersaturated solution, on the crystal growth plane of the seed crystal.

For production of a SiC single crystal as a practical material, it is necessary to increase the growth rate to improve production efficiency. Increasing the growth rate requires a higher degree of supersaturation D of the solute, but if the degree of supersaturation D exceeds a certain fixed value Dc the growth boundary becomes "a roughened surface" and it becomes impossible to maintain flat growth for continuous uniform single crystal growth.

PTL 1, in particular, discloses that for growth of a single crystal semiconductor by a Czochralski crystal growth process, it is necessary to delay the growth rate to the target diameter via the diameter-enlarging process by tapered growth from the seed crystal.

Also, PTLs 2 and 3 disclose that periodically varying the lifting speed when a Si single crystal is grown from a Si molten liquid increases the production efficiency (PTL 1) or results in a uniform oxygen concentration in the plane (PTL 2), causing growth of a Si single crystal.

However, these all involve growth from a Si "molten liquid", and merely utilize the fact that the molten liquid surface temperature is the melting point and that a Si single crystal grows by simply raising it to that height or greater, whereas they cannot be applied to methods in which a SiC single crystal grows by "supersaturation" of C from a Si—C "solution".

Consequently, it has been desired to develop a method of growing a SiC single crystal by a solution method, in which it is possible to maintain flat growth that allows continuous uniform single crystal growth, while also improving the growth rate necessary for realizing high productivity.

CITATION LIST

Patent Literature

[PTL 1] Japanese Unexamined Patent Publication No. 2003-512282
[PTL 2] Japanese Unexamined Patent Publication HEI No. 6-271388
[PTL 3] Japanese Unexamined Patent Publication HEI No. 6-316483

DISCLOSURE OF THE INVENTION

Problems to be Solved by the Invention

It is an object of the present invention to provide a method for manufacturing a SiC single crystal wherein, for growth of a SiC single crystal by a solution method, it is possible to maintain flat growth that allows continuous uniform single crystal growth, while also achieving an improvement in growth rate necessary for realizing high productivity.

Means for Solving the Problems

In order to achieve the object stated above, the present invention provides a method for manufacturing a SiC single crystal in which a SiC single crystal is grown from a Si solution of C in a crucible, employing alternate repetition between a high supersaturation growth period in which growth is allowed to progress while keeping the degree of supersaturation of C in the Si solution at the growth boundary between the growing SiC single crystal and the Si solution higher than a maximum critical value at which flat growth can be maintained, and a low supersaturation growth period in which growth is allowed to progress while keeping the degree of supersaturation lower than the critical value. A solution having a Si molten liquid as the solvent and C as the solute is referred to as a Si solution of C. The Si solution may contain Cr, Ni or the like in addition to C as the solute.

Effect of the Invention

In the present invention, a high growth rate is obtained in a growth section with a high degree of supersaturation while simultaneously generating a rough growth boundary, and the growth rate is reduced in a growth section with a low degree of supersaturation, but the rough growth boundary recovers and is flattened. Thus, according to the present invention, it is possible to achieve uniform single crystal growth at a higher growth rate than when growth is progressed while maintaining a lower degree of supersaturation than a critical value, as seen across all growth sections of the SiC single crystal.

DESCRIPTION OF EMBODIMENTS

Generally in crystal growth from a solution, the degree of supersaturation is a driving force for growth, and therefore increasing the degree of supersaturation can increase the growth rate.

On the other hand, the degree of supersaturation also strongly affects the condition of the growth boundary. With a degree of supersaturation that is in a range below or equal to a certain critical value, facet growth is continuous and a flat growth boundary is maintained. If the degree of supersaturation exceeds the critical value, however, two-dimensional critical nuclei are generated and roughness is produced at the growth boundary as growth proceeds. When growth proceeds in this manner, defects (such as solvent uptake) are generated due to the roughness of the growth boundary.

The present invention solves this problem of the prior art.

The principle of the invention will now be illustrated with reference to FIG. 1.

Figure 1:
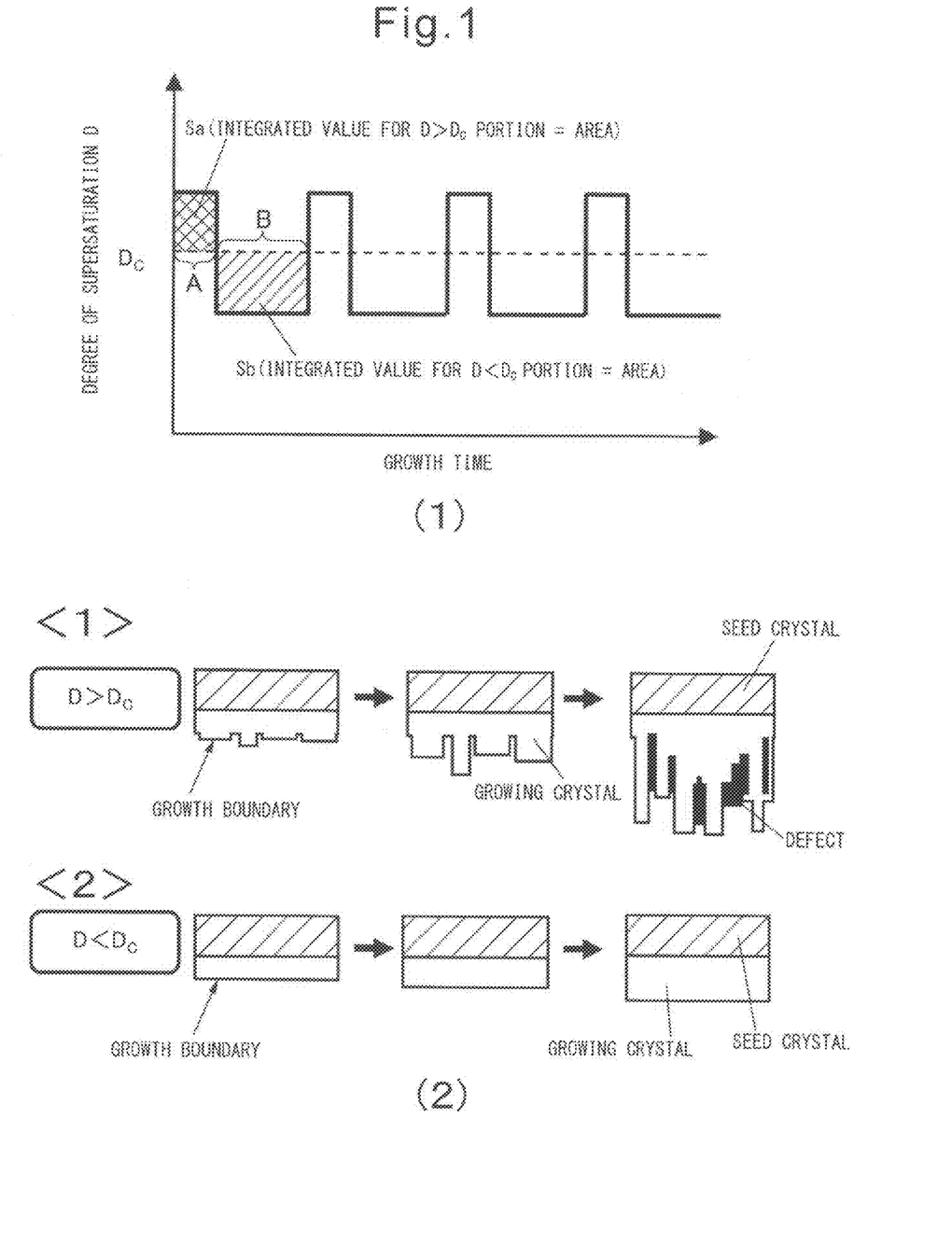
FIG. 1 shows (1) a method of periodically varying the degree of supersaturation with respect to a critical value and (2) the principle by which this method achieves a high growth rate while maintaining flat growth, according to the invention.

As shown in FIG. 1(1), according to the invention the degree of supersaturation D is repeatedly alternated between a high supersaturation growth period A that is higher and a low supersaturation growth period B that is lower, than the critical value (critical degree of supersaturation) Dc.

As shown in FIG. 1(2)<1>, the growth rate is rapid with growth under the high degree of supersaturation D>Dc, but roughness of the growth boundary increases and defects are generated in the grown crystal. In contrast, as shown in FIG. 1(2)<2>, with growth under the low degree of supersaturation D<Dc, facet growth is continuous and a flat growth boundary is maintained, ensuring uniform single crystal growth, but the slow growth rate and consequent high cost are obstacles to its utility.

The present inventors have completed this invention upon newly discovering that, as regards the relationship between the degree of supersaturation D and its critical value Dc, the rough, growth boundary can be restored to flat, even with growth with a high degree of supersaturation D>Dc, if it is switched to a low degree of supersaturation D<Dc during growth.

That is, as shown in FIG. 1(1), by repeatedly alternating a high supersaturation growth period A where D>Dc and a low supersaturation growth period B where D<Dc, it is possible to achieve growth at a higher growth rate, compared to conventional growth methods where growth is maintained with a low degree of supersaturation at D<Dc, without generating defects due to roughness of the growth boundary.

The present invention will now be explained in greater detail by examples.

EXAMPLES

For Examples 1, 2 and 3 below, there was used a Si solution having a composition of Si/Cr/Ni=54 at %/40 at %/6 at % as the amount charged into the graphite crucible, and including C dissolved from the graphite crucible.

Figure 2:
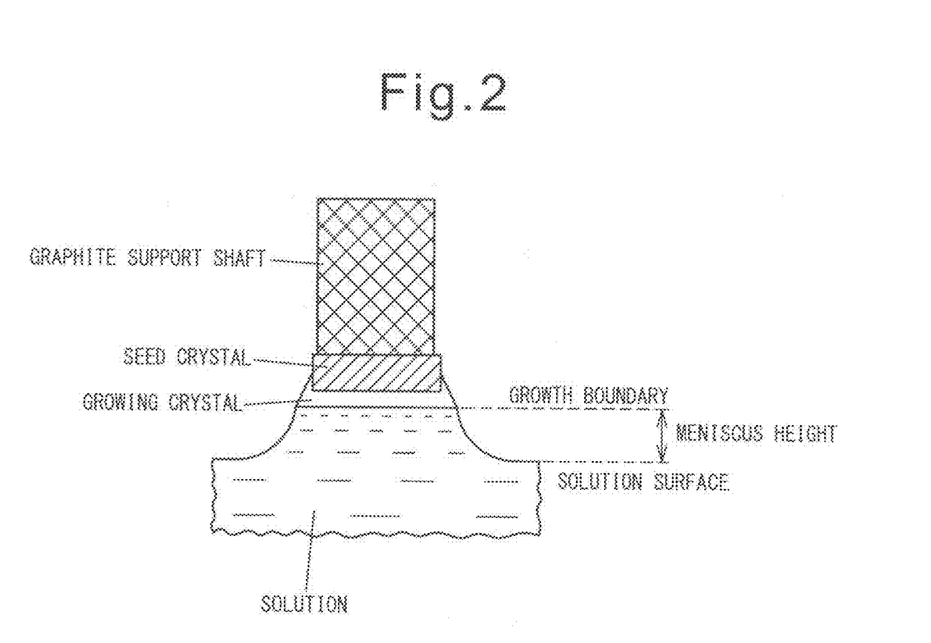
FIG. 2 shows the state near the growth boundary during single crystal growth by a solution method.

[Example 1] Variation in Degree of Supersaturation Due to Variation in Meniscus Height FIG. 2 shows the state near the growth boundary during single crystal growth by a solution method.

A seed crystal was held at the bottom edge of a graphite support shaft, and after contacting the seed crystal with the surface of the Si solution inside the crucible (not shown) and slightly raising it, a meniscus was formed by surface tension of the Si solution between the seed crystal and the Si solution surface. FIG. 2 shows a point of time when a SiC single crystal is growing on the bottom side of the seed crystal, and a meniscus is formed between the SiC single crystal growth boundary and the Si solution. The meniscus height is the height of the SiC single crystal growth boundary that has grown on the bottom side of the seed crystal, from the surface of the Si solution inside the crucible.

An increasing meniscus height corresponds to increased heat release from the meniscus and a lower solution temperature within the meniscus, which results in a higher degree of supersaturation of C directly under the growth boundary. The increased degree of supersaturation increases the growth rate, and if it exceeds a critical value flat growth can no longer be maintained.

First, as a preliminary experiment, growth was carried out with the meniscus height kept at different constant values.

Table 1 shows the change in growth rate with respect to the change in meniscus height, with success and failure of flat growth indicated as "Good" or "Poor". The Si solution has a surface temperature of 1996° C., an internal temperature of 2011° C. at a depth of 1 cm from the surface, and a temperature gradient of 15° C./cm.

TABLE 1

| Meniscus height (mm) | 0.5 | 1.0 | 1.5 | 2.0 | 2.5 |
| --- | --- | --- | --- | --- | --- |
| Growth rate (mm/hr) | 0.26 | 0.30 | 0.37 | 0.62 | 1.0 |
| Flat growth | Good | Good | Good | Poor | Poor |

As shown in Table 1, growth was carried out with the meniscus height kept at five levels from 0.5 to 2.5 mm. As a result, with increasing meniscus height the growth rate increased from 0.26 mm/hr to 1.0 mm/hr. Flat growth was maintained ("Good" in the table) with a meniscus height from 0.5 mm to 1.5 mm, but flat growth could not be maintained ("Poor" in the table) with a meniscus height of 2.0 mm or greater.

Figure 3:
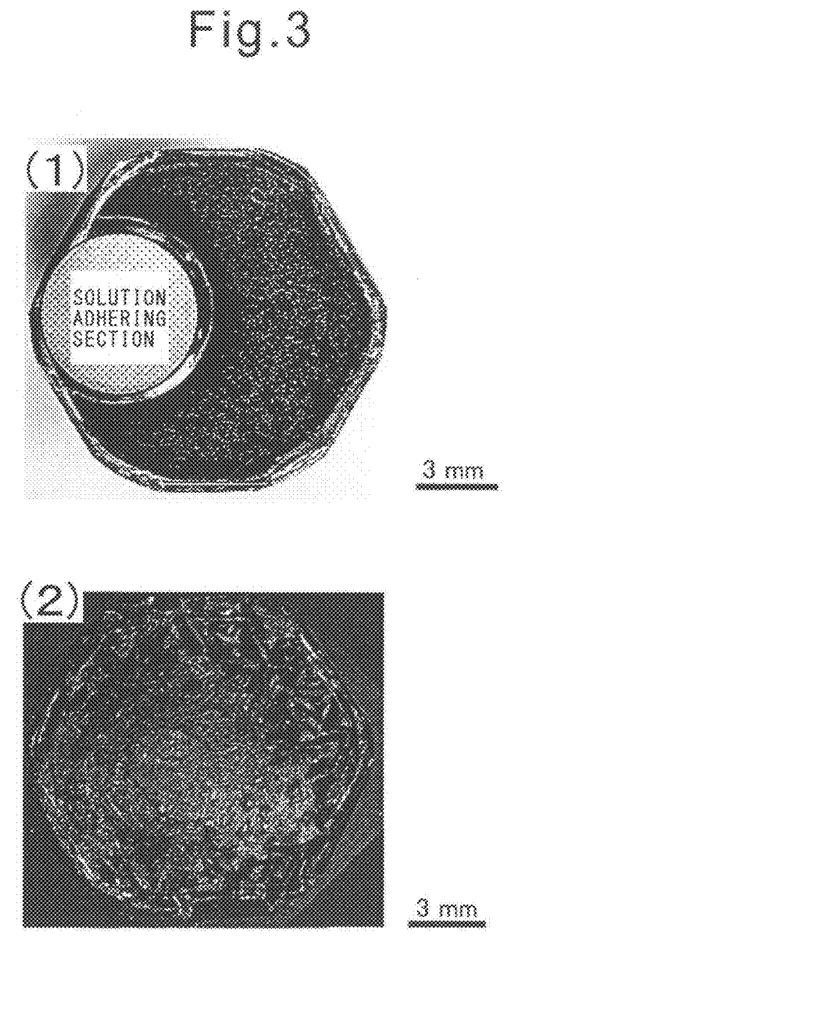
FIG. 3 is a pair of photographs showing (1) the end face of a SiC single crystal grown while maintaining a meniscus height below or equal to the critical value (upper limit), and (2) the end face of a SiC single crystal grown while maintaining a meniscus height above the critical value, in the preliminary experiment of Example 1.

FIG. 3 shows photographs of the end faces of grown crystals obtained thereby.

FIG. 3(1) is a case where the meniscus height was 1.0 mm and flat growth was maintained, and a smooth end face was obtained. The solution adhering section in the photograph is the trace of solution adhering to the end face when lifting from the solution surface after growth, and is unrelated to the success of crystal growth.

In contrast, FIG. 3(2) shows that flat growth could not be maintained with a meniscus height of 2.0 mm, there was severe roughness of the growth boundary, and a large amount of solution was adhering upon lifting.

Based on the results of this preliminary experiment, the upper limit, i.e. critical value for the meniscus height allowing flat growth to be maintained, was set at 1.5 mm.

Next, growth was carried out while varying the meniscus height above and below the critical value in order to change the degree of supersaturation. The three different variation patterns shown in FIG. 4 were used. As shown here, it repeatedly alternated between a growth period A with a high degree of supersaturation D>Dc and a growth period B with a low degree of supersaturation D<Dc.

Figure 4:
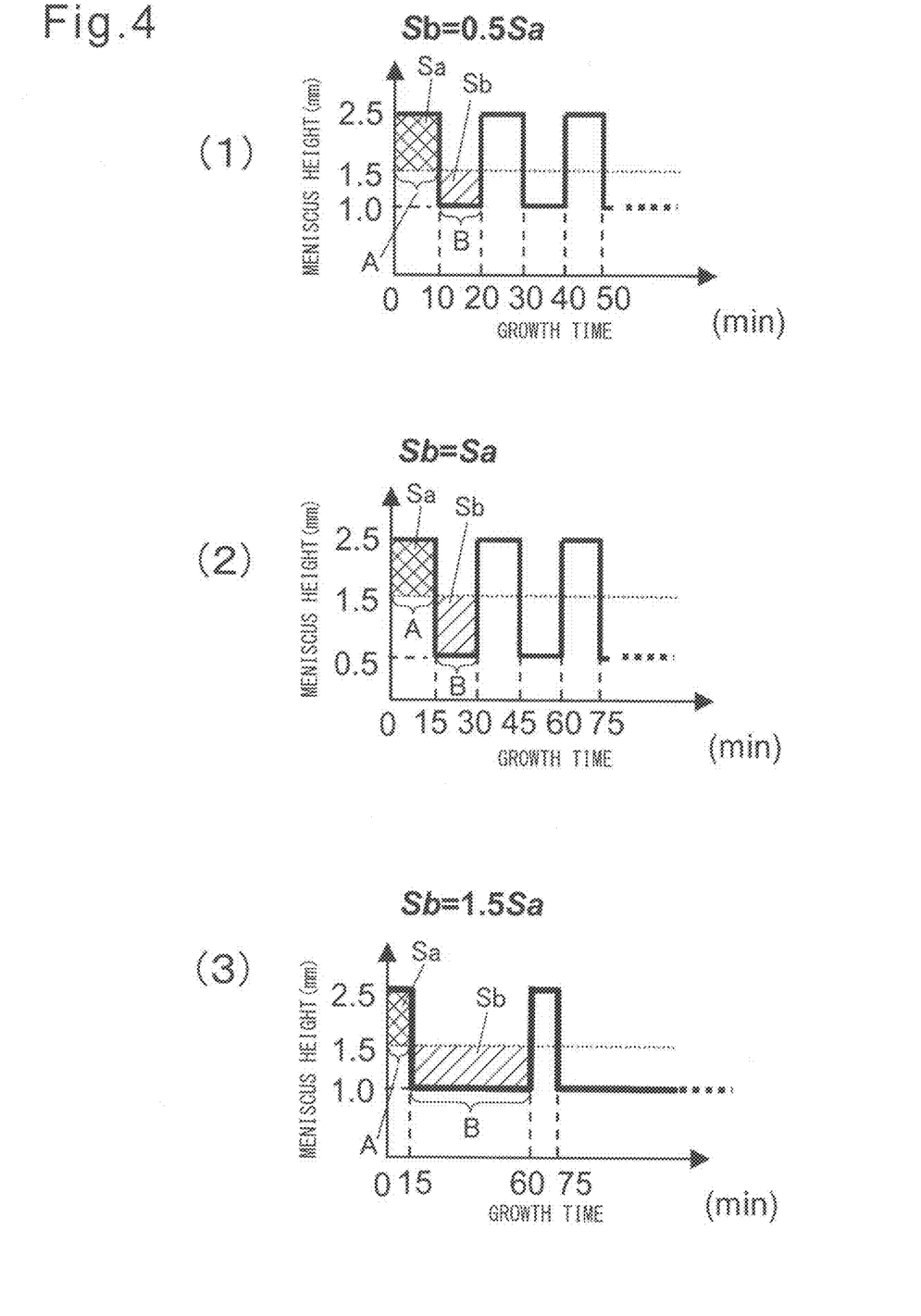
FIG. 4 is a set of graphs showing three different variation patterns for the meniscus height used in Example 1.

In the variation pattern shown in FIG. 4(1), the value Sb, which is the difference between the low meniscus height of 1.0 mm during the low supersaturation growth period B and the critical height of 1.5 mm, integrated over the growth period B, is ½ of the value Sa, which is the difference between the high meniscus height of 2.5 mm in the high supersaturation growth period A and the critical height of 1.5 mm, integrated over the growth period A, or in other words, Sb=0.5Sa.

In the variation pattern of FIG. 4(2), the integrated value Sa for the high supersaturation growth period A and the integrated value Sb for the low supersaturation growth period B are equal, or in other words, Sb=Sa.

In the variation pattern of FIG. 4(3), the integrated value Sb for the low supersaturation growth period B is 1.5 times the integrated value Sa for the high supersaturation growth period A, or in other words, Sb=1.5Sa.

Figure 5:
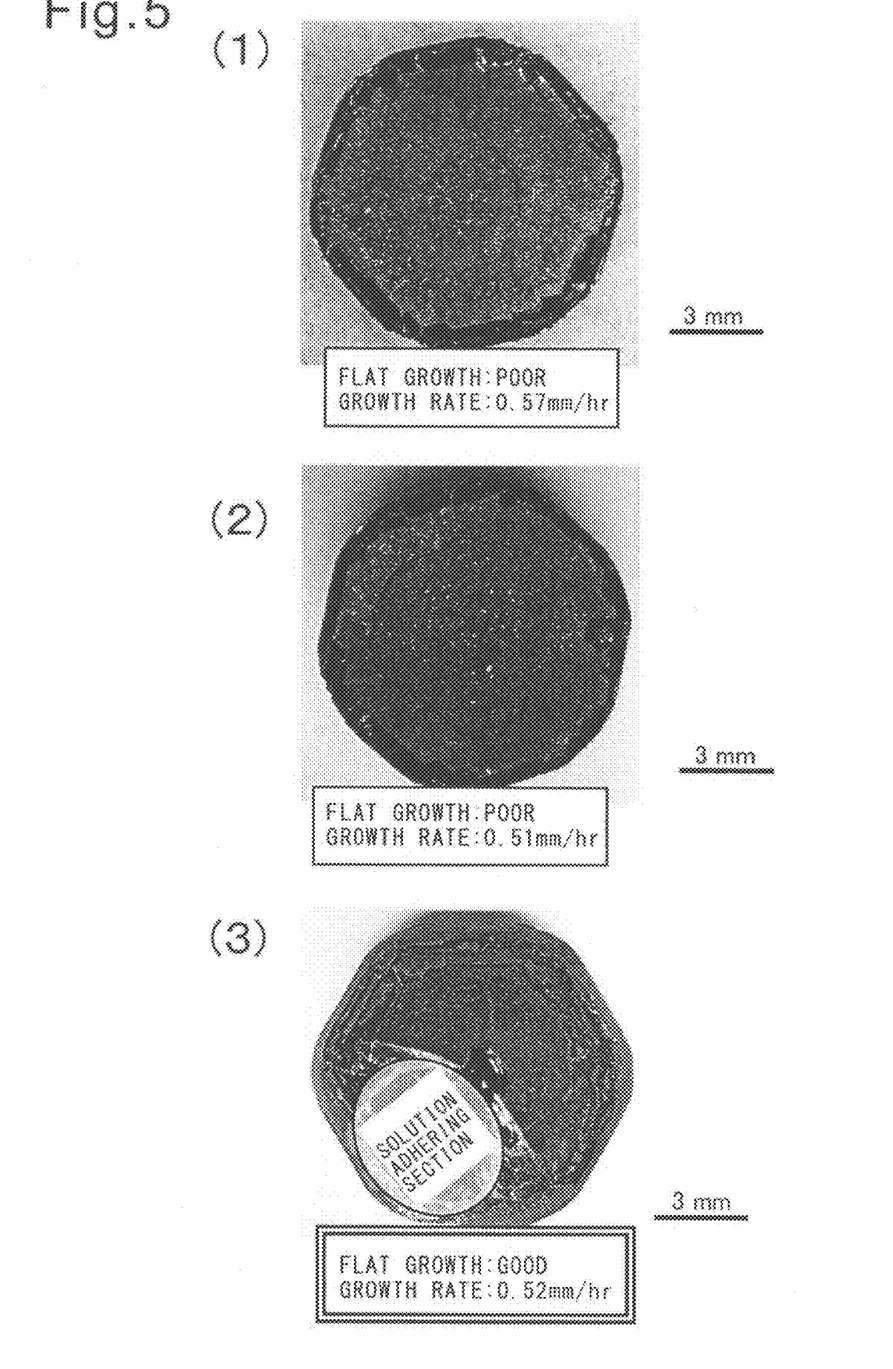
FIG. 5 is a set of photographs showing the end faces of SiC single crystals grown by each of the variation patterns of FIG. 4.

FIG. 5 is a set of photographs showing the end faces of SiC single crystals grown by each of the three different variation patterns.

FIG. 5(1) shows the state of the end face obtained by the variation pattern of FIG. 4(1), in which the growth rate was 0.57 mm/hr, but roughness of the growth boundary was severe and a large amount of solution was adhering.

FIG. 5(2) shows the state of the end face obtained by the variation pattern of FIG. 4(2), in which the growth rate was 0.51 mm/hr, but roughness of the growth boundary was severe and a large amount of solution was adhering.

FIG. 5(3) shows the state of the end face obtained by the variation pattern of FIG. 4(3), in which a growth rate of 0.52 mm/hr was obtained, the end face was smooth and flat growth was achieved. The growth rate was significantly improved compared to the growth rate of 0.37 mm/hr obtained with a critical meniscus height of 1.5 mm in which flat growth was obtained in the preliminary experiment.

Thus, according to the invention it is possible to significantly increase the growth rate while ensuring flat growth, by periodically varying the meniscus height with respect to the critical height, whereby the degree of supersaturation D of C at the growth boundary with respect to the critical value Dc is also periodically varied, and appropriately selecting the ratio of the integrated values Sa and Sb for the differences in the high supersaturation growth period A and the low supersaturation growth period B.

In this example, it is judged that it is possible to increase the growth rate while maintaining flat growth, in a range in which the relationship for the integrated differences is Sb≥1.5Sa. However, a larger Sb value will presumably slow the growth rate.

[Example 2] Variation in Degree of Supersaturation Due to Variation in Internal Temperature Gradient of Solution The temperature gradient in the Si solution was controlled by a two-stage high-frequency induction coil for crucible heating. A higher temperature gradient increases the degree of supersaturation directly under the growth boundary. The growth rate also increases concomitantly, but if the critical value is exceeded it is no longer possible to maintain flat growth.

First, as a preliminary experiment, growth was carried out with the temperature gradient kept at different constant values. The temperature gradient was defined as the difference between the surface temperature of the Si solution and the internal temperature at a depth of 1 cm from the surface.

Table 2 shows the change in growth rate with respect to the change in temperature gradient, with success and failure of flat growth indicated as "Good" or "Poor". The surface temperature of the Si solution was as shown in Table 2, with the meniscus height at a fixed value of 1 mm.

TABLE 2

| Solution surface temperature (° C.) | 1996 | 2008 | 2001 |
| --- | --- | --- | --- |
| Temperature gradient (° C./cm) | 15 | 30 | 40 |
| Growth rate (mm/hr) | 0.30 | 0.39 | 0.85 |
| Flat growth | Good | Good | Poor |

As shown in Table 2, growth was carried out while maintaining three levels for the temperature gradient in the Si solution: 15, 30 and 40° C./cm. As a result, the growth rate increased to 0.30, 0.39 and 0.85 mm/hr in response to the increase in temperature gradient. While flat growth was maintained with a temperature gradient in the range of 15° C. to 30° C./cm ("Good" in the table), flat growth could not be maintained when the temperature gradient increased to 40° C./cm ("Poor" in the table).

Figure 6:
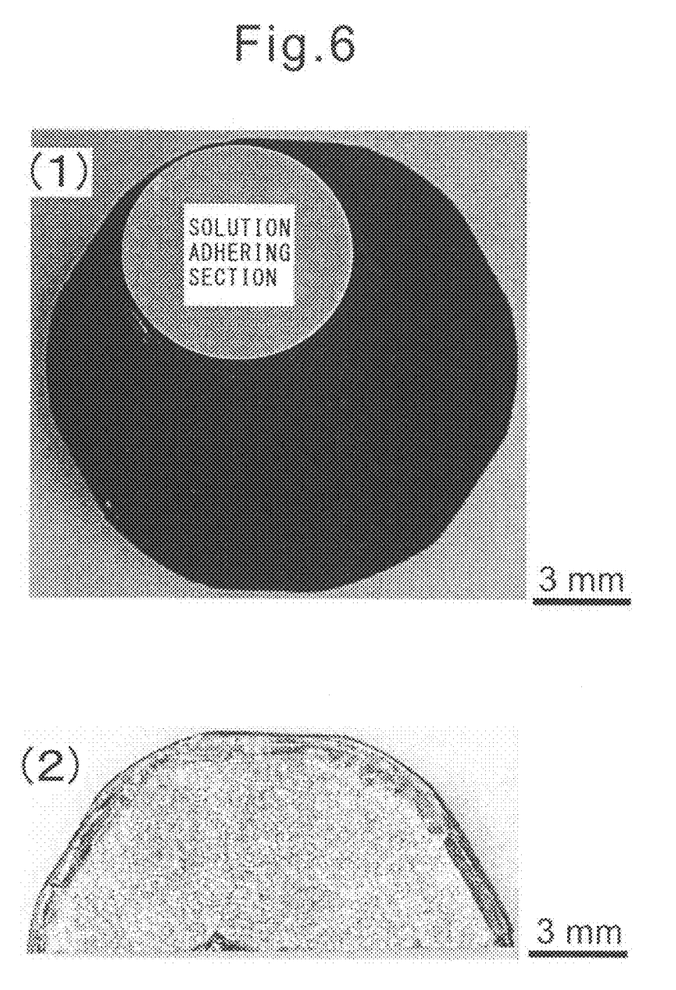
FIG. 6 is a pair of photographs showing (1) the end face of a SiC single crystal grown while maintaining a temperature gradient at the critical value (upper limit), and (2) the end face of a SiC single crystal grown while maintaining a temperature gradient above the critical value, in the preliminary experiment of Example 2.

FIG. 6 shows photographs of the end faces of grown crystals obtained thereby.

FIG. 6(1) is a case where the temperature gradient was 30° C./cm and flat growth was maintained, and a smooth end face was obtained.

In contrast, FIG. 6(2) is a case where flat growth could not be maintained with a temperature gradient of 40° C./cm, there was severe roughness of the growth boundary, and a large amount of solution was adhering upon lifting.

Based on the results of this preliminary experiment, the upper limit, i.e. critical value for the temperature gradient allowing flat growth to be maintained was set at 30° C./cm.

Figure 7:
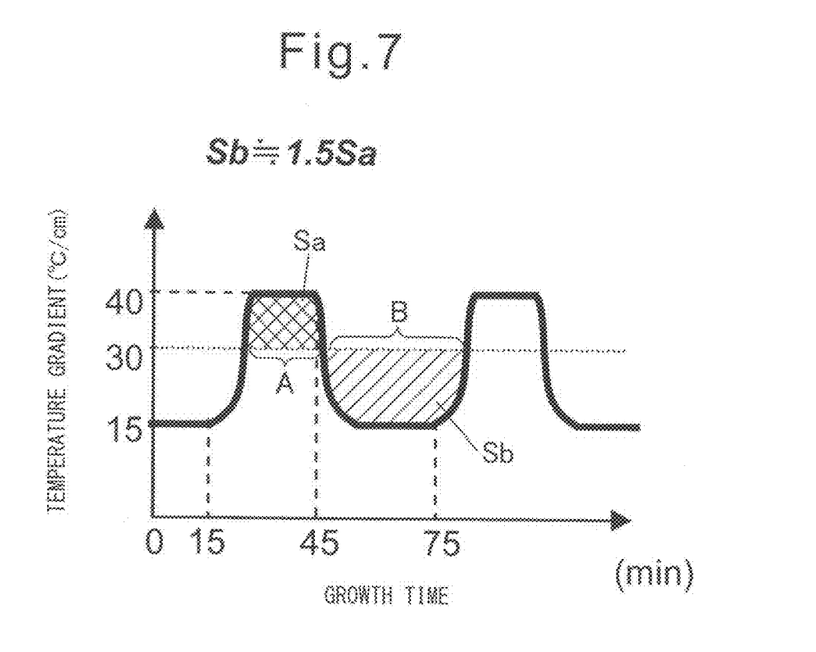
FIG. 7 is a graph showing a variation pattern for the temperature gradient used in Example 2.

Next, growth was carried out while varying the temperature gradient above and below the critical value in order to change the degree of supersaturation. The variation pattern was such that, based on the results of Example 1 and as shown in FIG. 7, the integrated value Sb for the differences between the low temperature gradient of 15° C./cm in the low supersaturation growth period B and the critical value of 30° C./cm was 1.5 times the integrated value Sa for the difference between the high temperature gradient of 40° C./cm in the high supersaturation growth period A and the critical value of 30° C./cm, i.e. Sb=1.5Sa. Because of the long time required for variation compared to the pattern of Example 1, the variation in the temperature gradient had a stronger degree of curvature at the boundary, as shown in FIG. 7.

Figure 8:
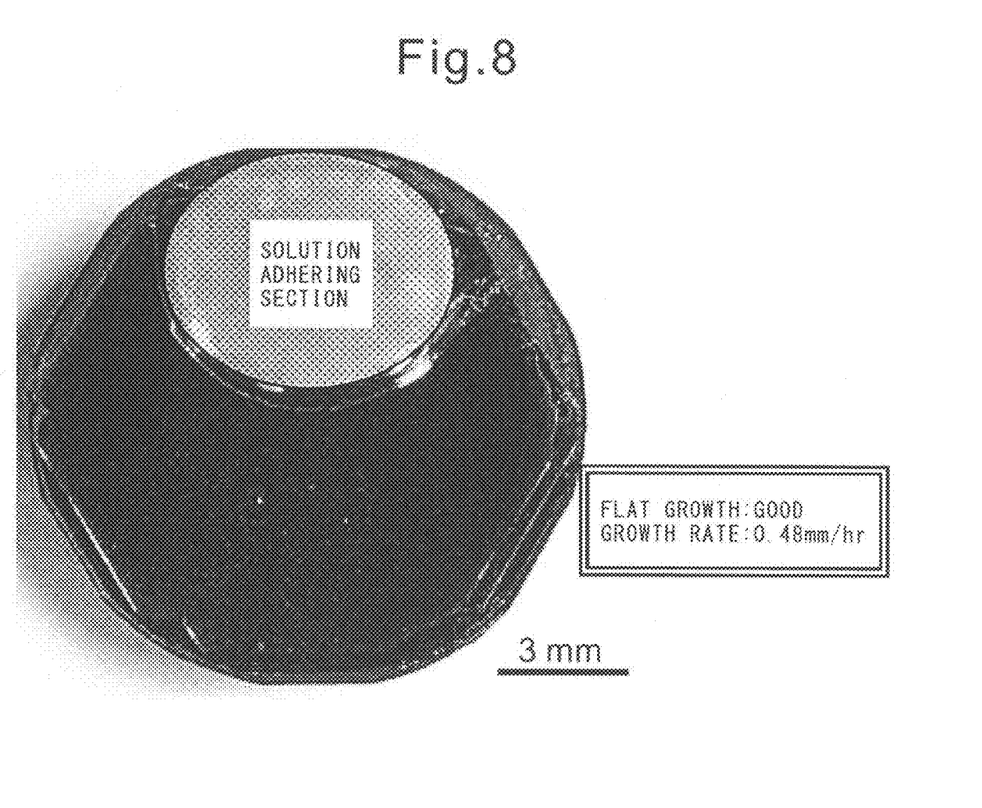
FIG. 8 is a photograph showing the end face of a SiC single crystal grown by the variation pattern of FIG. 7.

FIG. 8 is a photograph showing the end face of a SiC single crystal grown by this variation pattern. As shown in the photograph, the end face was smooth and flat growth was achieved. Furthermore, the growth rate was 0.48 mm/hr, which was significantly improved compared to the growth rate of 0.39 mm/hr obtained with a critical temperature gradient of 30° C./cm in which flat growth was obtained in the preliminary experiment.

Thus, according to the invention it is possible to significantly increase the growth rate while ensuring flat growth, by periodically varying the temperature gradient with respect to the critical value, whereby the degree of supersaturation D of C at the growth boundary with respect to the critical value Dc is also periodically varied, and appropriately selecting the ratio of the integrated values Sa and Sb for the differences in the high supersaturation growth period A and the low supersaturation growth period B.

In this example, it is judged that it is possible to increase the growth rate while maintaining flat growth, in a range in which the relationship for the integrated differences is Sb≥1.5Sa. However, a larger Sb value will presumably slow the growth rate.

[Example 3] Effect of Temperature Gradient in Vertical Direction of Support Shaft For this example, the effect of the temperature gradient (ΔX) in the vertical direction of the support shaft was examined. A greater value for ΔX results in greater heat loss from the support shaft, a higher degree of supersaturation and a larger growth rate.

Specifically, ΔX=80° C./cm in Examples 1 and 2. In this example, the value was larger, i.e., ΔX=85° C./cm, and the degree of supersaturation was varied by varying the meniscus height as in Example 1. The value of ΔX is the mean temperature gradient from the seed crystal to 20 cm above on the support shaft.

First, as a preliminary experiment, growth was carried out with the meniscus height kept at different constant values.

Table 3 shows the change in growth rate with respect to the change in meniscus height, with success and failure of flat growth indicated as "Good" or "Poor". The Si solution has a surface temperature of 1996° C., an internal temperature of 2011° C. at a depth of 1 cm from the surface, and a temperature gradient of 15° C./cm.

TABLE 3

| Meniscus height (mm) | 1.0 | 1.3 | 1.5 | 2.0 |
|---|---|---|---|---|
| Growth rate (mm/hr) | 0.56 | 0.60 | 0.77 | 1.0 |
| Flat growth | Good | Good | Poor | Poor |

As shown in Table 3, growth was carried out with the meniscus height kept at four levels from 1.0 to 2.0 mm. As a result, with increasing meniscus height the growth rate increased from 0.56 mm/hr to 1.0 mm/hr.

In this example, heat loss from the support shaft resulted in a higher growth rate compared to the growth rate of 0.30 to 0.62 mm/hr with the same meniscus height range of 1.0 to 2.0 mm as in Example 1.

Flat growth was maintained ("Good" in the table) with a meniscus height from 1.0 mm to 1.3 mm, but flat growth could not be maintained ("Poor" in the table) with a meniscus height of 1.5 mm or greater.

Figure 9:
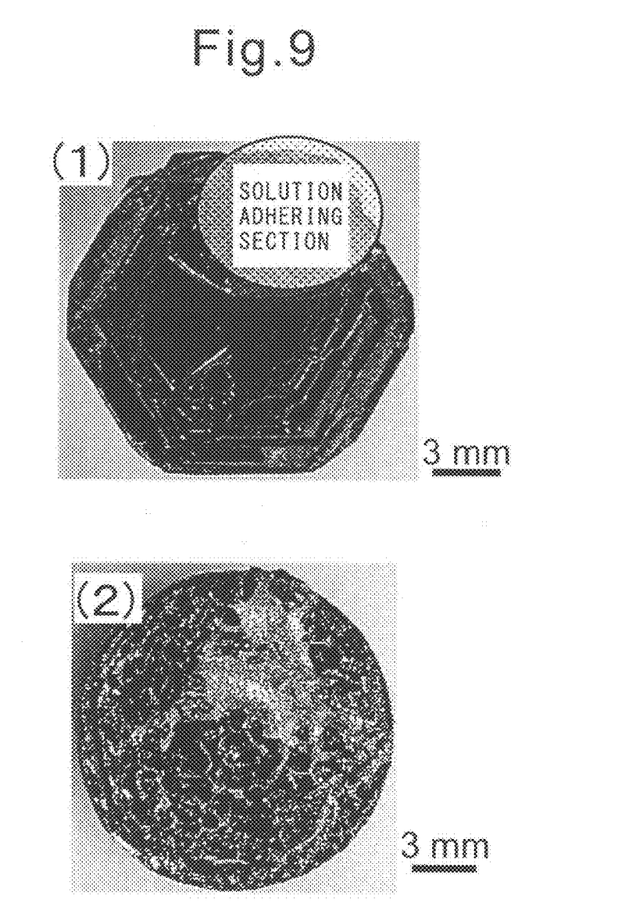
FIG. 9 is a pair of photographs showing (1) the end face of a SiC single crystal grown while maintaining a meniscus height below or equal to the critical value (upper limit), and (2) the end face of a SiC single crystal grown while maintaining a meniscus height above the critical value, in the preliminary experiment of Example 3.

FIG. 9 shows photographs of the end faces of grown crystals obtained thereby.

FIG. 9(1) is a case where the meniscus height was 1.0 mm and flat growth was maintained, and a smooth end face was obtained. The solution adhering section in the photograph is the trace of solution adhering to the end face when lifting from the solution surface after growth, and is unrelated to the success of crystal growth.

In contrast, FIG. 9(2) shows that flat growth could not be maintained with a meniscus height of 2.0 mm, there was severe roughness of the growth boundary, and a large amount of solution was adhering upon lifting.

Based on the results of this preliminary experiment, the upper limit, i.e. critical value for the meniscus height allowing flat growth to be maintained was set at 1.3 mm.

Next, growth was carried out while varying the meniscus height above and below the critical value in order to change the degree of supersaturation. The two different variation patterns shown in FIG. 10 were used. As shown here, it repeatedly alternated between a growth period A with a high degree of supersaturation D>Dc and a growth period B with a low degree of supersaturation D<Dc.

Figure 10:
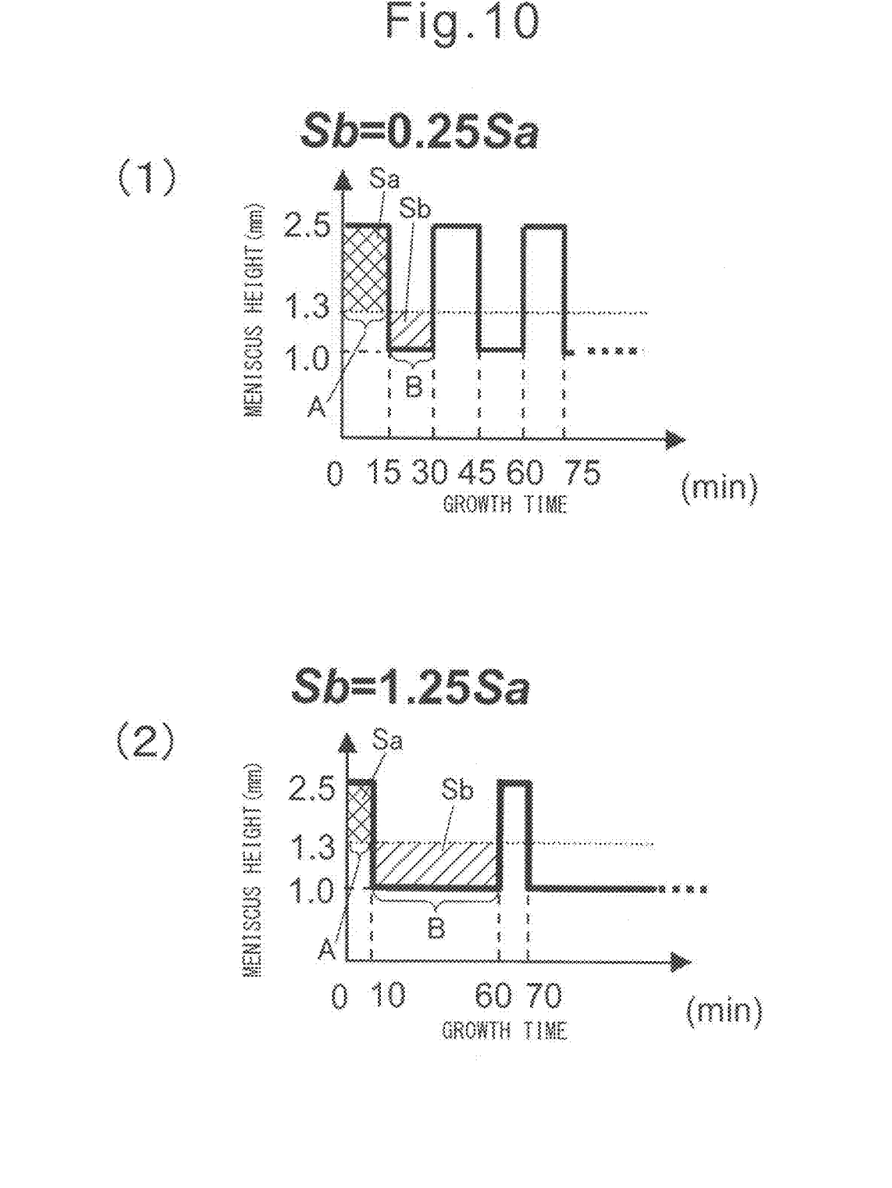
FIG. 10 is a pair of graphs showing two different variation patterns for the meniscus height used in Example 3.

In the variation pattern shown in FIG. 10(1), the value Sb, which is the difference between the low meniscus height of 1.0 mm during the low supersaturation growth period B and the critical height of 1.5 mm, integrated over the growth period B, is ¼ of the value Sa, which is the difference between the high meniscus height of 2.5 mm in the high supersaturation growth period A and the critical height of 1.3 mm, integrated over the growth period A, or in other words, Sb=0.25Sa.

In the variation pattern of FIG. 10(2), the integrated value Sb for the low supersaturation growth period B is 1.25 times the integrated value Sa for the high supersaturation growth period A, or in other words, Sb=1.25Sa.

Figure 11:
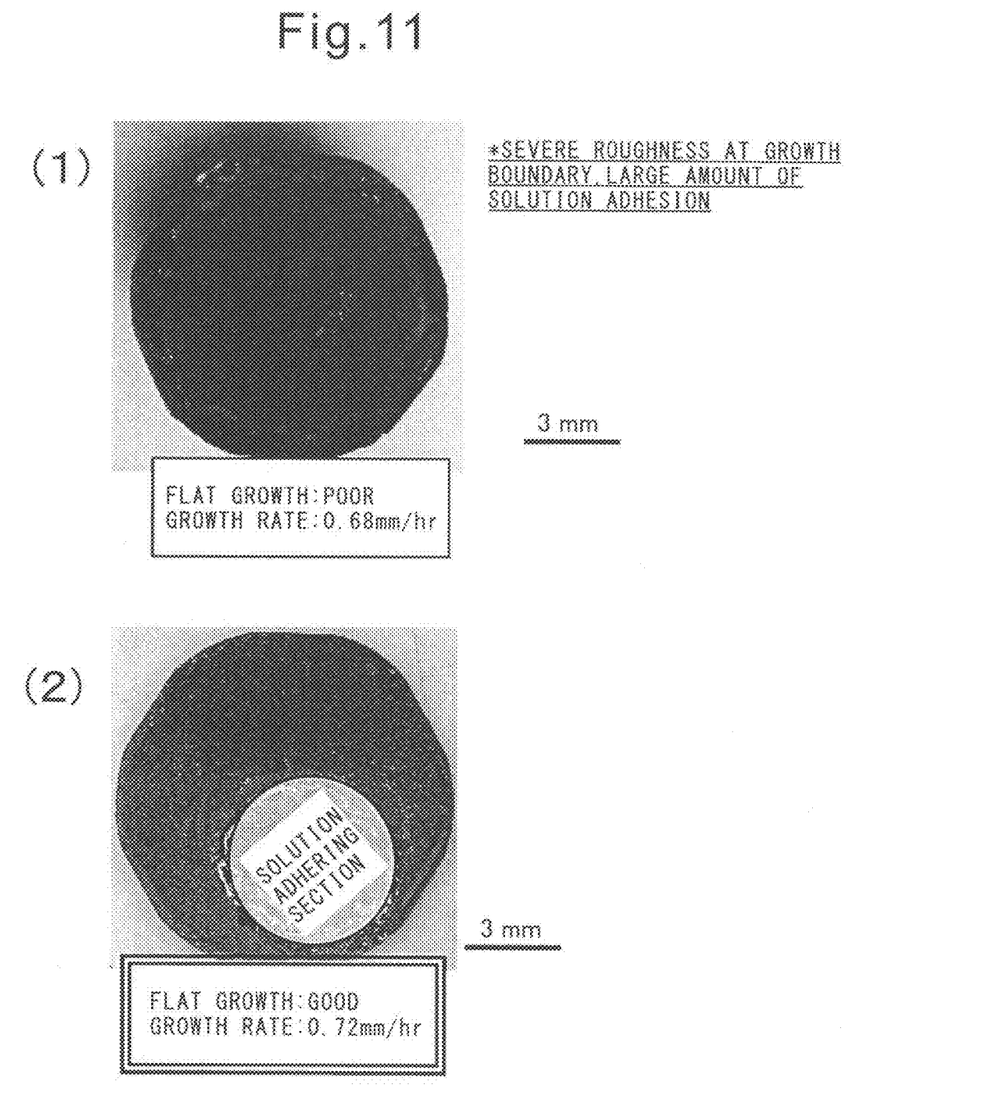
FIG. 11 is a pair of photographs showing the end faces of SiC single crystals grown by each of the variation patterns of FIG. 10.

FIG. 11 is a set of photographs showing the end faces of SiC single crystals grown by each of the two different variation patterns.

FIG. 11(1) shows the state of the end face obtained by the variation pattern of FIG. 10(1), in which the growth rate was 0.68 mm/hr, but roughness of the growth boundary was severe and a large amount of solution was adhering.

FIG. 11(2) shows the state of the end face obtained by the variation pattern of FIG. 10(2), in which a growth rate of 0.72 mm/hr was obtained, the end face was flat and flat growth was achieved. The growth rate was significantly improved compared to the growth rate of 0.60 mm/hr obtained with a critical meniscus height of 1.3 mm in which flat growth was obtained in the preliminary experiment. In addition, this growth rate was significantly improved with respect to the maximum growth rate of 0.52 mm/hr obtained by variation pattern (3) in Example 1.

Thus, according to the invention the temperature gradient in the vertical direction of the support shaft is increased (the heat loss effect from the support shaft is reinforced), thereby resulting in a more notable effect of increase in the rate of flat growth by the variation pattern of the invention. In addition, based on Examples 2 and 3, it is judged that the relationship Sb≥1.25Sa is suitable in order to increase the growth rate while maintaining flat growth.

INDUSTRIAL APPLICABILITY

According to the invention there is provided a method for manufacturing a SiC single crystal wherein, for growth of a SiC single crystal by a solution method, it is possible to maintain flat growth that allows continuous uniform single crystal growth, while also achieving an improvement in growth rate necessary for realizing high productivity.

What is claimed is:

1. A method for manufacturing a SiC single crystal in which a SiC single crystal is grown from a Si solution of C in a crucible, employing alternate repetition between a high supersaturation growth period in which growth is progressed while keeping a degree of supersaturation of C in the Si solution at a growth boundary between the growing SiC single crystal and the Si solution higher than a maximum critical value at which flat growth can be maintained, and a low supersaturation growth period in which growth is progressed while keeping the degree of supersaturation lower than the critical value, wherein the ratio between a value Sa which is the difference between the high degree of supersaturation and the critical value integrated over a continuous time during the high supersaturation growth period, and a value Sb which is the difference between the low degree of supersaturation and the critical value integrated over a continuous time during the low supersaturation growth period, Sb/Sa, is greater than or equal to 1.25.

2. A method for manufacturing a SiC single crystal in which a SiC single crystal is grown from a Si solution of C in a crucible, employing alternate repetition between a high supersaturation growth period in which growth is progressed while keeping a degree of supersaturation of C in the Si solution at a growth boundary between the growing SiC single crystal and the Si solution higher than a maximum critical value at which flat growth can be maintained, and a low supersaturation growth period in which growth is progressed while keeping the degree of supersaturation lower than the critical value, wherein the degree of supersaturation is varied by varying a height of a meniscus formed from the growth boundary up to a surface of the Si solution in the crucible.

3. The method for manufacturing a SiC single crystal according to claim 1, wherein the degree of supersaturation is varied by varying a temperature gradient in the Si solution in the crucible.

4. The method for manufacturing a SiC single crystal according to claim 1, wherein the degree of supersaturation is varied by varying a height of a meniscus formed from the growth boundary up to a surface of the Si solution in the crucible.

* * * * *